US007973276B2

(12) United States Patent
Cunningham et al.

(10) Patent No.: US 7,973,276 B2
(45) Date of Patent: Jul. 5, 2011

(54) CALIBRATION METHOD FOR VIDEO AND RADIATION IMAGERS

(75) Inventors: Mark F. Cunningham, Oak Ridge, TN (US); Lorenzo Fabris, Knoxville, TN (US); Timothy F. Gee, Oak Ridge, TN (US); James S. Goddard, Jr., Knoxville, TN (US); Thomas P. Karnowski, Knoxville, TN (US); Klaus-peter Ziock, Clinton, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 169 days.

(21) Appl. No.: 12/511,385

(22) Filed: Jul. 29, 2009

(65) Prior Publication Data

US 2011/0024611 A1      Feb. 3, 2011

(51) Int. Cl.
*G01D 18/00* (2006.01)
(52) U.S. Cl. .................................................... 250/252.1
(58) Field of Classification Search ............... 250/208.1, 250/252.1, 336.1; 382/103–107, 291
See application file for complete search history.

(56) References Cited

U.S. PATENT DOCUMENTS

| 4,642,687 | A | * | 2/1987 | Wedgwood et al. | 348/162 |
| 5,286,973 | A | * | 2/1994 | Westrom et al. | 250/253 |
| 5,371,370 | A | * | 12/1994 | Lightfoot | 250/363.02 |
| 6,597,818 | B2 | | 7/2003 | Kumar et al. | |
| 6,755,537 | B1 | | 6/2004 | Raskar et al. | |
| 6,782,123 | B1 | * | 8/2004 | Guillon et al. | 382/154 |
| 2004/0124359 | A1 | * | 7/2004 | Hamrelius et al. | 250/341.6 |
| 2006/0125920 | A1 | | 6/2006 | Criminisi et al. | |
| 2006/0170768 | A1 | * | 8/2006 | Riley | 348/143 |
| 2007/0117576 | A1 | * | 5/2007 | Huston | 455/461 |
| 2008/0302967 | A1 | * | 12/2008 | Klann et al. | 250/336.1 |
| 2009/0021614 | A1 | | 1/2009 | Baker et al. | |
| 2009/0195655 | A1 | * | 8/2009 | Pandey | 348/158 |

OTHER PUBLICATIONS

Schneid et al., GammaModelerTM, 3-D Gamma Ray Imaging Technology.
Ziock et al., "The Use of Gamma-Ray Imaging to Improve Portal Monitor Performance", 2007 IEEE Nuclear Science Symposium Conference Record, 2007, pp. 1198-1208.
Ziock et al., "The Use of Gamma-Ray Imaging to Improve Portal Monitor Performance", IEEE Transactions on Nuclear Science, 2008, pp. 3654-3664, vol. 55, No. 6.

* cited by examiner

*Primary Examiner* — David P Porta
*Assistant Examiner* — Marcus H Taningco
(74) *Attorney, Agent, or Firm* — Scully, Scott, Murphy & Presser, P.C.

(57) ABSTRACT

The relationship between the high energy radiation imager pixel (HERIP) coordinate and real-world x-coordinate is determined by a least square fit between the HERIP x-coordinate and the measured real-world x-coordinates of calibration markers that emit high energy radiation imager and reflect visible light. Upon calibration, a high energy radiation imager pixel position may be determined based on a real-world coordinate of a moving vehicle. Further, a scale parameter for said high energy radiation imager may be determined based on the real-world coordinate. The scale parameter depends on the y-coordinate of the moving vehicle as provided by a visible light camera. The high energy radiation imager may be employed to detect radiation from moving vehicles in multiple lanes, which correspondingly have different distances to the high energy radiation imager.

41 Claims, 9 Drawing Sheets

_US 7,973,276 B2_

CALIBRATION METHOD FOR VIDEO AND RADIATION IMAGERS

STATEMENT REGARDING FEDERALLY SPONSORED RESEARCH OR DEVELOPMENT

This invention was made with United States government support under Prime Contract No. DE-AC05-00OR22725 awarded by the U.S. Department of Energy. The United States government has certain rights in this invention.

FIELD OF THE INVENTION

The present invention relates to the field of visible light camera image processing, and particularly to apparatus and methods for correlating high energy radiation imager pixels of a high energy radiation imager to a real-world coordinate of a moving vehicle.

BACKGROUND OF THE INVENTION

Rapid-deployment portal monitors employing visible light imaging and gamma ray imaging has been proposed. For example, K. Ziock, "The Use of Gamma-Ray Imaging to Improve Portal Monitor Performance," 2007 IEEE Nuclear Science Symposium Conference, pp. 1198-1208 (2007) discloses simultaneous monitoring of multiple lanes of traffic from the side of a roadway. A roadside tracker may employ automated target acquisition and tracking software to identify and track vehicles in visible light images.

In this setup, the field of view of a visible light camera is calibrated to the field of view of a high energy radiation imager. The high energy radiation imager "harvests" the gamma ray data specific to each vehicle, integrating its radiation signature for the entire time that is in the field of view of the high energy radiation imager. Thus, vehicle-specific radiation signature may be generated while avoiding source confusion problems that plague non-imaging approaches to the problem of deterring unlawful transportation of radioactive materials.

Typically, the high energy radiation imager and the visible light camera in such a system have significantly different installation locations. Typically, the light visible light camera is installed above the height of vehicles to overlook the passing vehicles to capture as many features of passing vehicles as possible. The bulky high energy radiation imager is typically installed at the height of the passing vehicles to maximize the capture of radiation signals. Because of the different geometry employed for the two types of imagers, cross-calibration between the two types of imagers poses a difficulty. However, a highly accurate correlation between the pixel coordinates of the high energy radiation imager and the visible light camera is required in such a scenario to accurately track moving vehicles that potentially carry radioactive materials.

In view of the above and other reasons, there exists a need for a method for accurately determining the correlation between the high energy radiation imager pixel coordinates and the visible light camera pixel correlations.

SUMMARY OF THE INVENTION

In one embodiment of the present invention, the relationship between the high energy radiation imager pixel (HERIP) coordinate and real-world x-coordinate is determined by a least square fit between the HERIP x-coordinate and the measured real-world x-coordinates of calibration markers that emit high energy radiation and reflect visible light. Upon calibration, a high energy radiation imager pixel position may be determined based on a real-world coordinate of a moving vehicle. Further, a scale parameter for the high energy radiation imager may be determined based on the real-world coordinate. The scale parameter depends on the y-coordinate of the moving vehicle as provided by a visible light camera. The high energy radiation imager may be employed to detect radiation from moving vehicles in multiple lanes, which correspondingly have different distances to the high energy radiation imager.

According to an aspect of the present invention, an apparatus for detecting a radiation source is provided. The apparatus includes:

a visible light camera that detects electromagnetic radiation in a visible range;

a high energy radiation imager that detects high energy radiation; and an image analysis device that is configured to execute a program of machine-executable instructions to calibrate high energy radiation imager pixels of the high energy radiation imager to a real-world coordinate of a moving vehicle, wherein the program includes the steps of:

determining a visible light camera pixel coordinate of a moving vehicle;

determining a real-world coordinate of the moving vehicle based on the visible light camera pixel coordinate;

determining a high energy radiation imager pixel position based on the real-world coordinate of the moving vehicle; and determining a scale parameter for the high energy radiation imager based on the real-world coordinate, wherein the scale parameter correlates a change in the high energy radiation imager pixel position to a change in an x-coordinate of the real-world coordinate in a real-world coordinate system having an x-axis that is parallel to an image plane of the high energy radiation imager.

In one embodiment, the program further includes the step of determining a speed of the vehicle based on at least two images from the visible light camera.

In another embodiment, the program further includes the step of determining a rate of change in the high energy radiation imager pixel position based on the speed and the scale parameter.

In even another embodiment, the rate of change in the high energy radiation imager pixel is equal to a product of the speed and the scale parameter.

In yet another embodiment, the image analysis device is configured to execute another program of machine-executable instructions to integrate an intensity of detected high energy radiation imager around the high energy radiation imager pixel position over time, wherein the high energy radiation imager pixel position changes at a rate of change that is calculated from the speed and the scale parameter.

In still another embodiment, the rate of change in the high energy radiation imager pixel is equal to a product of the speed and the scale parameter.

In still yet another embodiment, the program further includes the step of repeating the step of determining the visible light camera pixel coordinate and the step of determining the high energy radiation imager pixel position while the moving vehicle remains in a field of view of the visible light camera and in a field of view of the high energy radiation imager.

In a further embodiment, the program further includes the steps of:

determining a length of the moving vehicle based on an image of the visible light camera; and determining a high energy radiation imager pixel range corresponding to the length based on the scale parameter, wherein the high energy radiation imager pixel range is proportional to the scale parameter.

In an even further embodiment, the program further includes determining a baseline scale parameter that represents a change in a baseline high energy radiation imager pixel position of the high energy radiation imager as a function of a real-world coordinate having a variable real-world x-coordinate and a fixed real-world y-coordinate, wherein a y-axis of the fixed real-world y-coordinate is perpendicular to an image plane of the high energy radiation imager.

In a yet further embodiment, the program further includes the step of performing a least square fitting between multiple values of the baseline high energy radiation imager pixel position and corresponding multiple real-world coordinates having the variable real-world x-coordinate and the fixed real-world y-coordinate, wherein the baseline scale parameter is selected to minimize a fitting error in the least square fitting.

In a still further embodiment, the program further includes the step of performing a distortion correction operation on an image generated by the visible light camera to generate a distortion-corrected image.

In a still yet further embodiment, the program further includes the step of performing a homography transformation on the distortion-corrected image to generate a homographied image.

In further another embodiment, the homographied image has a homography reference frame that coincides with a surface of a road on which the moving vehicle travels, wherein distances between any pair of points located directly on the road is proportional to distances between a corresponding pair of pixels in the homographied image.

In even further another embodiment, the program further includes the step of determining the real-world coordinate employing a pixel coordinate in the homographied image.

According to another aspect of the present invention, a method for calibrating high energy radiation imager pixels to a real-world coordinate of a moving vehicle is provided. The method includes:

generating a visible light camera image of a moving vehicle;

determining a visible light camera pixel coordinate of the moving vehicle in the visible light camera image;

determining a real-world coordinate of the moving vehicle based on the visible light camera pixel coordinate;

determining a high energy radiation imager pixel position of a high energy radiation imager based on the real-world coordinate of the moving vehicle; and determining a scale parameter for the high energy radiation imager based on the real-world coordinate, wherein the scale parameter correlates a change in the high energy radiation imager pixel position to a change in an x-coordinate of the real-world coordinate in a real-world coordinate system having an x-axis that is parallel to an image plane of the high energy radiation imager.

According to yet another aspect of the present invention, a method of detecting a radiation source is provided. The method includes:

providing a visible light camera that detects electromagnetic radiation in a visible range;

providing a high energy radiation imager that detects high energy radiation; and calibrating high energy radiation imager pixels to a real-world coordinate of a moving vehicle by generating a visible light camera image of a moving vehicle; by determining a visible light camera pixel coordinate of the moving vehicle in the visible light camera image; by determining a real-world coordinate of the moving vehicle based on the visible light camera pixel coordinate; by determining a high energy radiation imager pixel position of a high energy radiation imager based on the real-world coordinate of the moving vehicle; and by determining a scale parameter for the high energy radiation imager based on the real-world coordinate, wherein the scale parameter correlates a change in the high energy radiation imager pixel position to a change in an x-coordinate of the real-world coordinate in a real-world coordinate system having an x-axis that is parallel to an image plane of the high energy radiation imager; and integrating an intensity of detected high energy radiation imager around the high energy radiation imager pixel position over time, wherein the high energy radiation imager pixel position changes at a rate of change that is calculated from the speed and the scale parameter.

In one embodiment, the rate of change in the high energy radiation imager pixel is equal to a product of the speed and the scale parameter.

According to still another aspect of the present invention, a machine-readable data storage device embodying a program of machine-executable instructions to calibrate high energy radiation imager pixels to a real-world coordinate of a moving vehicle is provided. The program includes the steps of:

determining a visible light camera pixel coordinate of a moving vehicle in a visible light camera image;

determining a real-world coordinate of the moving vehicle based on the visible light camera pixel coordinate;

determining a high energy radiation imager pixel position of a high energy radiation imager based on the real-world coordinate of the moving vehicle; and determining a scale parameter for the high energy radiation imager based on the real-world coordinate, wherein the scale parameter correlates a change in the high energy radiation imager pixel position to a change in an x-coordinate of the real-world coordinate in a real-world coordinate system having an x-axis that is parallel to an image plane of the high energy radiation imager.

DETAILED DESCRIPTION OF THE INVENTION

Figure 1:
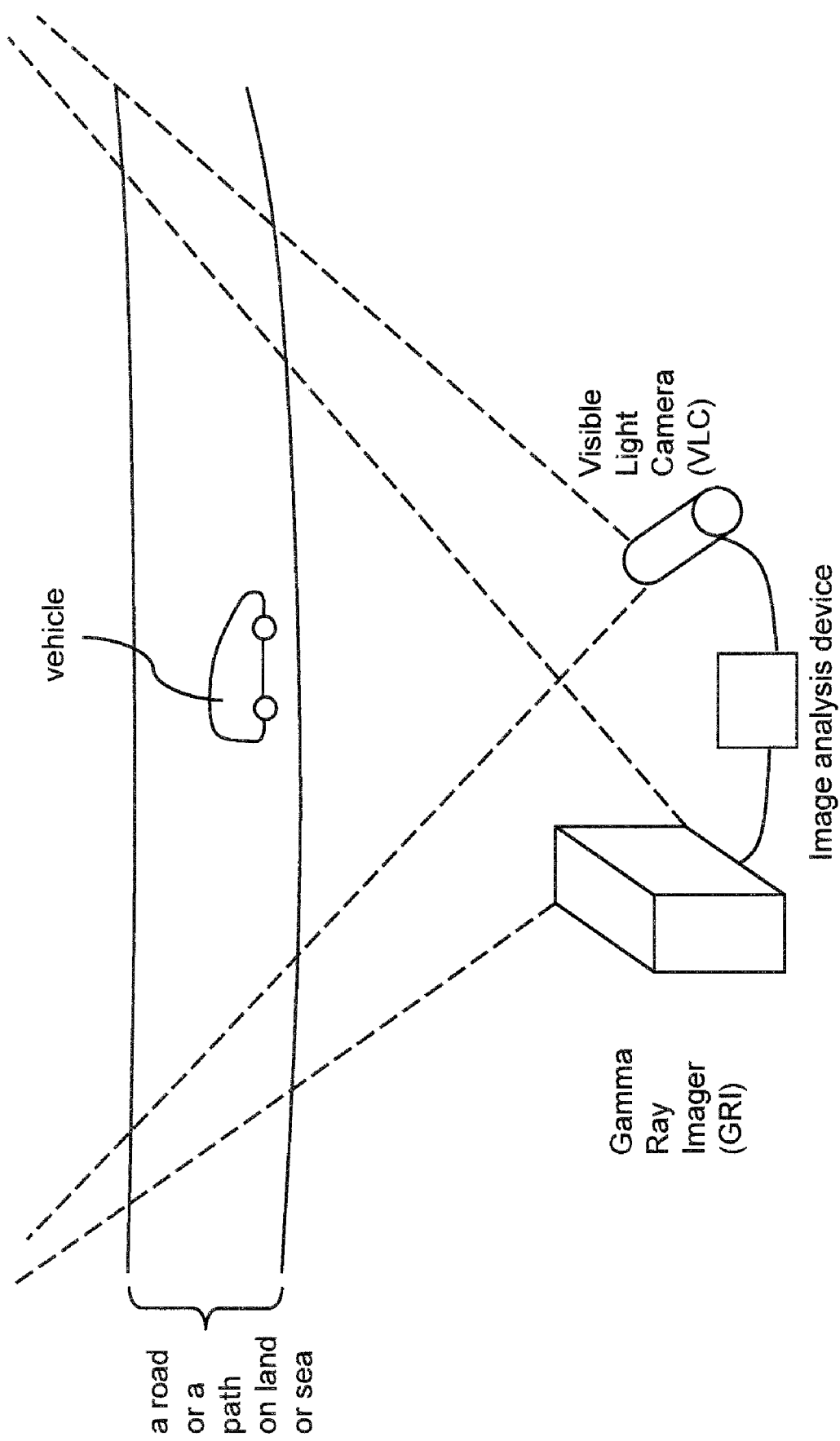
FIG. 1 is a schematic bird's eye view of an apparatus configured to detect a radiation source on moving vehicles according to the present invention.

As stated above, the present invention relates to apparatus and methods for correlating high energy radiation imager pixels of a high energy radiation imager to a real-world coordinate of a moving vehicle. The present invention is now described in detail with accompanying figures. It is noted that like and corresponding elements mentioned herein and illustrated in the drawings are referred to by like reference numerals.

As used herein, "visible light camera images" refer to any type of data set in digital format that may be manipulated by a computing device.

As used herein, a "time series" refers to a group of at least two elements that are generated at different points in time.

As used herein, a "vehicle" refers to any transportation equipment that moves on a surface. A vehicle may be, but is not limited to, a car or a truck moving on a road or any other solid surface, a ship moving on water, or any other manned or unmanned object that moves on a solid surface or a liquid surface while transporting personnel or a cargo.

As used herein, "high energy radiation" refers to electromagnetic radiation or a particle radiation having an energy per particle or photon of 120 eV or greater. The "high energy radiation" includes X-ray that has a photon energy from 120 eV to 120 keV and gamma ray radiation having a photon energy of 120 keV or greater. The "high energy radiation" includes particle radiations such as electron beams, proton beams, alpha particle beams, and any other charged particle beam that has per-particle energy of 120 eV or greater.

As used herein, a "visible light camera" refers to any optical equipment that is capable of generating a digital image of objects in a field of view based on electromagnetic radiation within the visible range that is captured by the optical equipment.

As used herein, a "high energy radiation imager" refers to any equipment that is capable of generating a digital image of objects in a field of view based on high energy radiation that is captured or detected by the equipment.

As used herein, a "real-world coordinate" is a coordinate within the physical universe.

As used herein, a "scale parameter" is a proportionality constant that correlates a change in one quantity to a change in another quantity.

As used herein, "homography" or "homography transformation" is a transformation that transforms straight lines in a physical plane within the field of view of a visible light camera image to a straight line in a transformed image.

As used herein, a "homographied image" is an image generated by a homography transformation on a visible light camera image.

As used herein, a "homography reference plane" is a physical plane including straight lines that are transformed into straight lines in a homographied image by a homography transformation.

Figure 2:
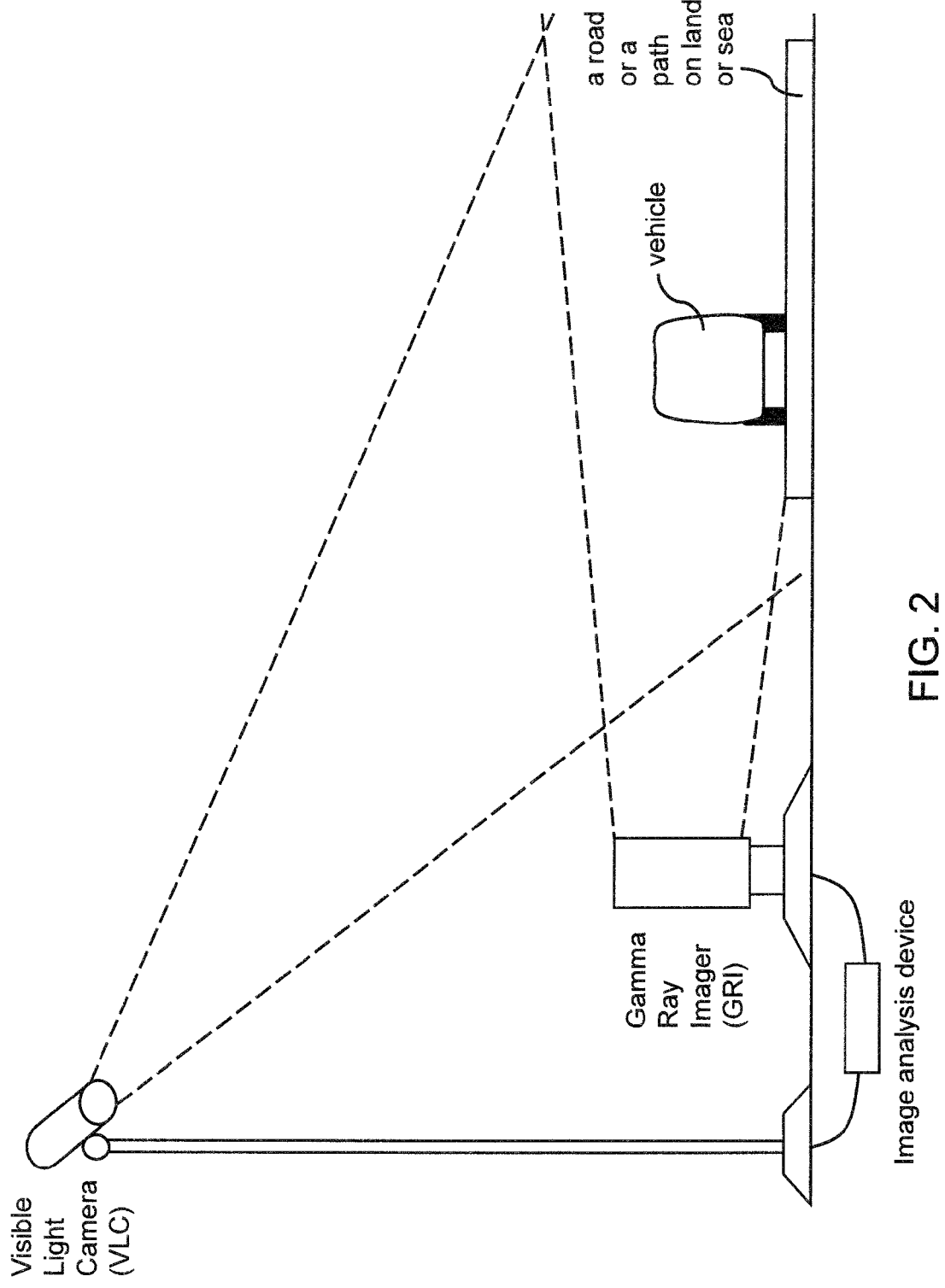
FIG. 2 is schematic lateral see-through view of the apparatus of FIG. 1 according to an embodiment of the present invention.

Referring to FIGS. 1 and 2, an exemplary apparatus configured to detect a radiation source on moving vehicles is shown. The exemplary apparatus includes a visible light camera that detects electromagnetic radiation in a visible range, a high energy radiation imager that detects high energy radiation, and an image analysis device that is configured to execute a program of machine-executable instructions to calibrate high energy radiation imager pixels of the high energy radiation imager to a real-world coordinate of a moving vehicle. The exemplary apparatus may include any additional visible light camera which, if present, may be employed to increase the accuracy of the real-world coordinate by analyzing and integrating data from multiple visible light cameras. In one embodiment, the high energy radiation imager is a gamma ray imager that detects gamma ray radiation.

The real-world coordinate is a coordinate of the real-world, and may be a two-dimensional Cartesian coordinate representing a two-dimensional plane that coincides with, or is parallel to, the surface on which the moving vehicle travels. Alternately, the real-world coordinate may be any other type of two-dimensional coordinate, such as a two-dimensional polar coordinate, that coincides with, or is parallel to, the surface on which the moving vehicle travels. Yet alternately, the real-world coordinate may be a three-dimensional coordinate. In this case, the methods of the present invention may be applied by selecting a two-dimensional coordinate as a subset of the three-dimensional coordinate such that the two-dimensional coordinate includes information on the location of the moving vehicle in a plane parallel to the surface on which the moving vehicle travels. While a Cartesian (x, y) coordinate system is employed for the real-world coordinate to describe the present invention, any other two-dimensional coordinate system may be employed as well through use of a coordinate system conversion into a Cartesian (x, y) coordinate system.

The visible light camera may continuously monitor a path of moving vehicles and provides a time series of visible light camera images, i.e., a time series of images as captured by the visible light camera, in real time to the image analysis device. Alternately, the time series of visible light camera images may be stored in the image analysis device and used during execution of a program by the image analysis device. The exemplary apparatus also includes a high energy radiation imager that continuously monitors the path of vehicles and provides a time series of high energy radiation images in real time to the image analysis device.

The image analysis device may be any device that is configured to execute a program of machine-executable instructions to identify a height of a group of salient points of a moving object in a time series of visible light camera images. The image analysis device may include a processor and peripheral components in a computer.

Optionally, an image recording device may be employed to store a time series of visible light camera images or a time series of high energy radiation images from the high energy radiation image. Typically, the image recording device is embedded in the computer or externally connected to the computer. Alternately, the image recording device may be embedded in a visible light camera, which may feed a time series of visible light camera images to a computer through signal ports and a cable or by wireless connection. Yet alternately, the image recording device may be embedded in a high energy radiation imager, which may feed a time series of high energy radiation images to a computer through signal ports and a cable or by wireless connection.

A machine-readable data storage device may be employed to embody or to store a program of machine-executable instructions. Upon execution, the program of machine-executable instructions may identify a height of a group of salient points of a moving object according to embodiments of the present invention.

The exemplary apparatus is calibrated in two stages. The first stage of calibration is a static calibration that is performed with calibration markers that are placed in fixed positions. The result from the first stage of calibration is a parametrized formula that determines the high energy radiation imager pixel position based on the real-world coordinate of a moving vehicle yet to be detected. The second stage of calibration is a dynamic calibration that may be performed for each moving vehicle. The real-world coordinate of a moving vehicle is extracted from a visible light camera image and is provided as the parameters in the calibration formula so that a corresponding high energy radiation imager pixel position is calculated for each real-world coordinate of a moving vehicle. As such, the result of the second stage of calibration is valid only for the moving vehicle on which the second stage of calibration is performed. In the second stage of calibration, the high energy radiation imager is dynamically calibrated based on the visible light camera pixel coordinate of the moving vehicle as determined by a corresponding visible light camera image. Thus, the calibration of the high energy radiation imager changes depending on the location of the moving vehicle as detected by the visible light camera.

Figure 3:
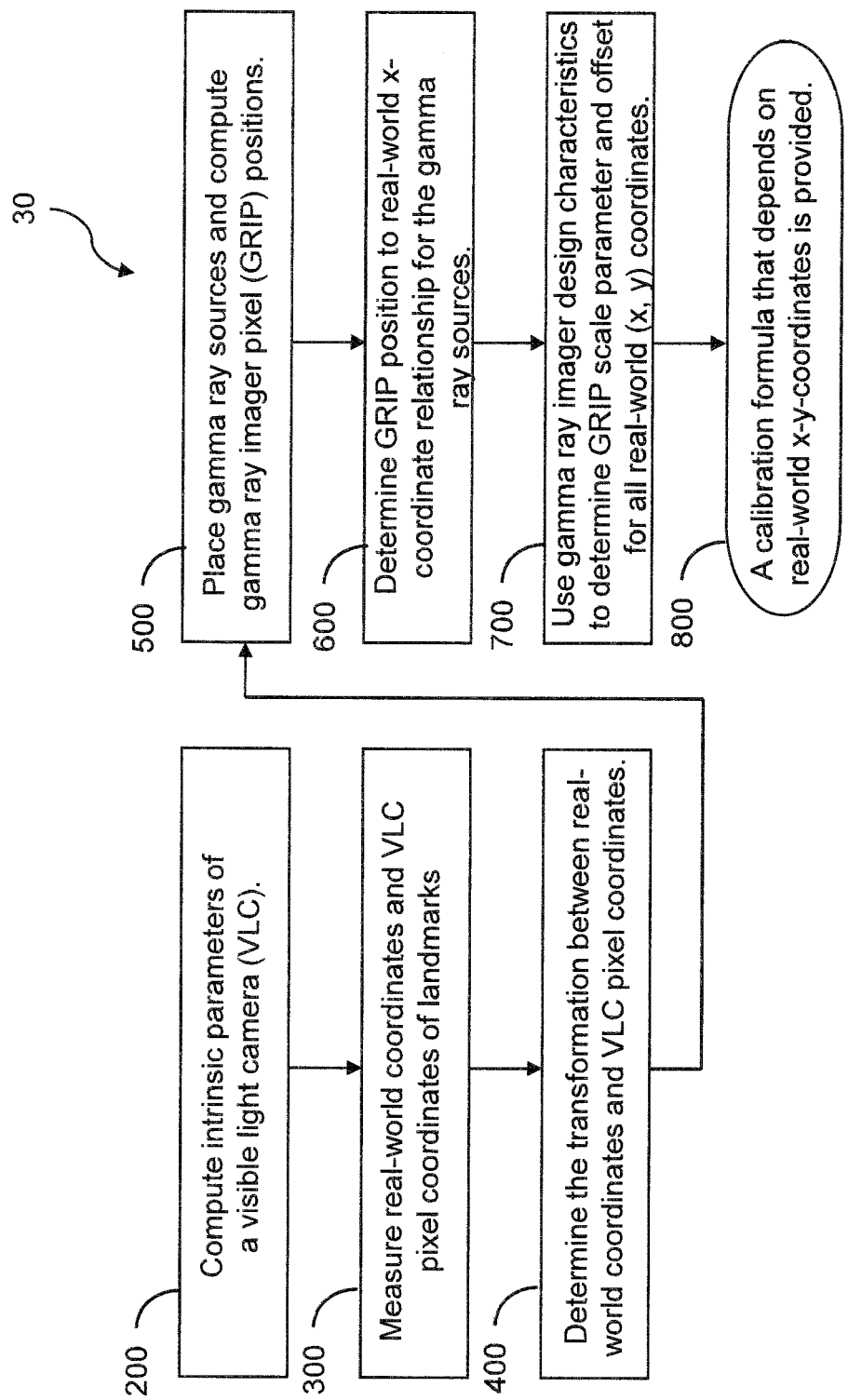
FIG. 3 is a flow chart illustrating the method of dynamically calibrating the high energy radiation imager of the apparatus of the present invention employing images generated by a visible light camera according to an embodiment of the present invention.

The program that may be run by the image analysis device includes the steps of determining a visible light camera pixel coordinate of a moving vehicle, determining a real-world coordinate of the moving vehicle based on the visible light camera pixel coordinate, determining a high energy radiation imager pixel position based on the real-world coordinate of the moving vehicle, determining a scale parameter for the high energy radiation imager based on the real-world coordinate, and integrating an intensity of detected high energy radiation imager around the high energy radiation imager pixel position over time, wherein the high energy radiation imager pixel position changes at a rate of change that is calculated from the speed and the scale parameter. The scale parameter correlates a change in the high energy radiation imager pixel position to a change in an x-coordinate of the real-world coordinate. Preferably, the x-axis of the real-world coordinate system is parallel to an image plane of the high energy radiation imager Referring to FIG. 3, a flow chart 30 illustrates the method of dynamically calibrating the high energy radiation imager of the apparatus of the present invention employing images generated by a visible light camera. The steps of the flow chart 30 may be implemented by the exemplary apparatus in FIGS. 1 and 2.

Referring to step 200 of the flow chart 30, intrinsic parameters of a visible light camera is computed. The intrinsic parameters of the cameras include various factors that cause distortion in the visible light camera image generated by the visible light camera such as distortion caused by the lens. The intrinsic parameters of the visible light camera may be computed during an off-line calibration process, which may employ an optimization software and checkerboard patterns. For example, a plurality of images at predefined angles may be generated on checkerboard patterns and the intrinsic parameters of the visible light camera may be extracted by commercially available software. The intrinsic parameters of the visible light camera may include, for example, a focal length, the optical center, and a radial lens distortion.

Referring to step 300 of the flow chart 30, real-world coordinates of landmarks and visible light camera pixel coordinates of the same landmarks are measured. The measurement of the real-world coordinates may be done by physically measuring the distances between pairs of the landmarks. The measurement of the visible light camera pixel coordinates may be done manually or through automated software by identifying the pixel coordinates of the landmarks in the images of the area monitored by the visible light camera. The visible light camera may have a fixed field of view, or may have a variable field of view that is effected by a change of angle or position of the visible light camera. The landmarks may be any object, naturally present or placed by humans, at fixed locations within the field of view of the visible light camera. Preferably, the landmarks are employed to provide high contrast against the background for easy identification in the visible light camera image. The visible light camera pixel coordinates are pixel coordinates in the images generated by the visible light camera.

Referring to step 400 of the flow chart 30, a coordinate transformation between the real-world coordinates and the visible light camera pixel coordinates is determined by correlating the real-world coordinates of the landmarks and the visible light camera pixel coordinates of the landmarks. Intermediary image transformations may be employed to facilitate the coordinate transformation between the between the real-world coordinates and the visible light camera pixel coordinates.

For example, visible light camera images may be transformed into distortion-corrected images through a first image transformation. The distortion-corrected images may then be transformed into homogrphied images through a homography transformation, which is a second image transformation.

Figure 4A:
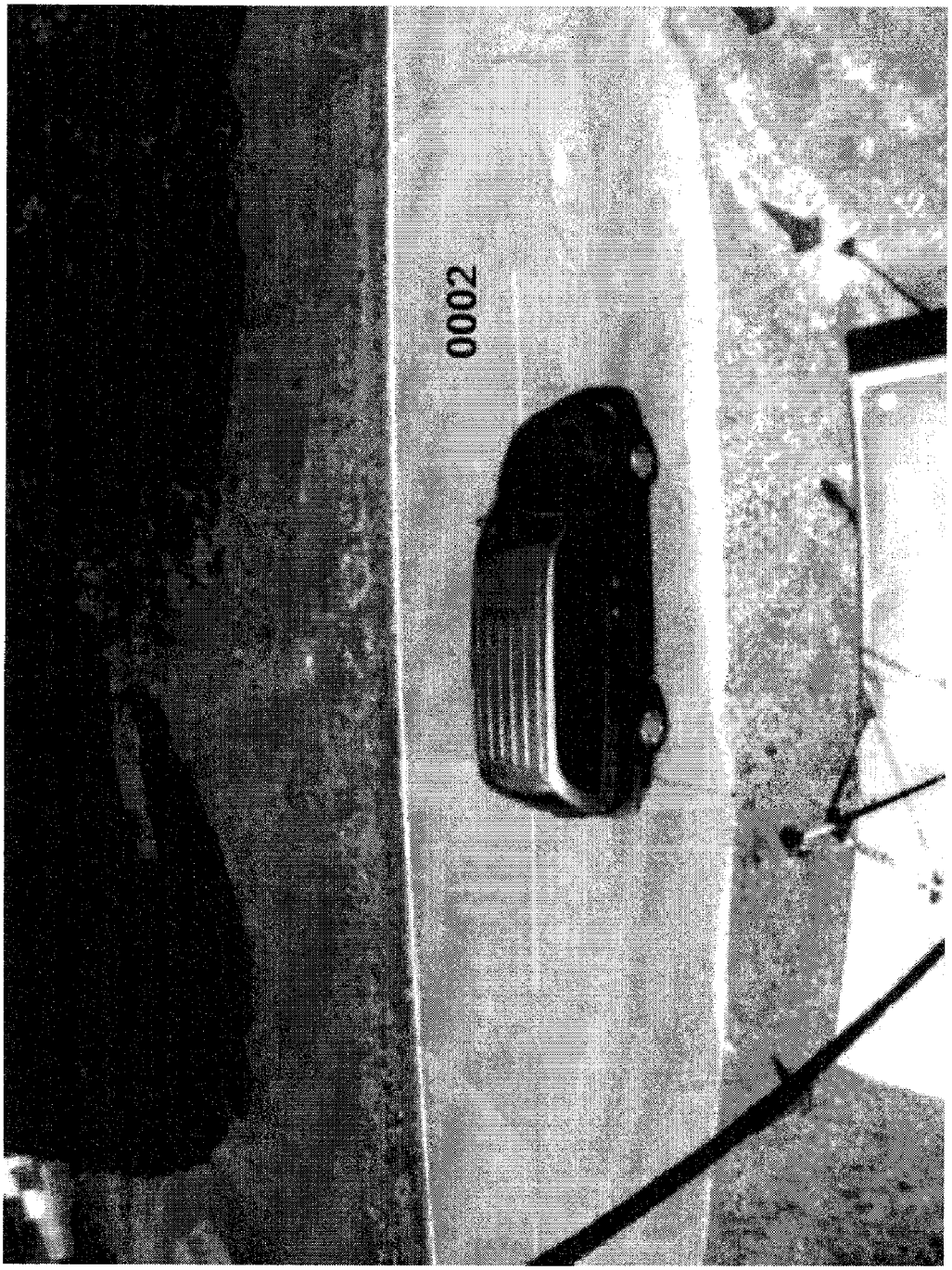
FIG. 4A is an exemplary visible light camera image generated by a visible light camera according to an embodiment of the present invention.
Figure 4B:
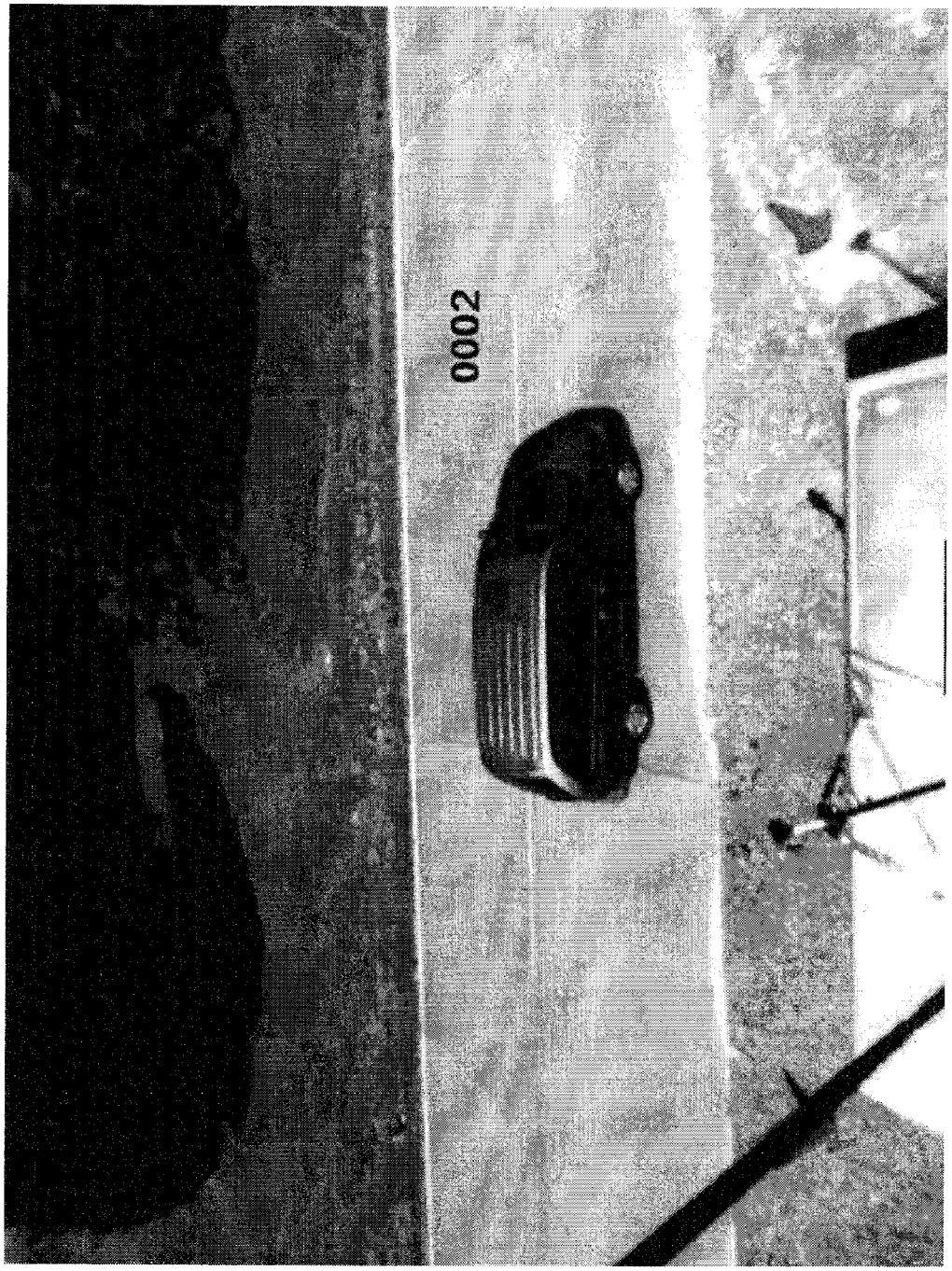
FIG. 4B is an exemplary distortion-corrected image generated from the exemplary visible light camera image in FIG. 4A according to an embodiment of the present invention.
Figure 4C:
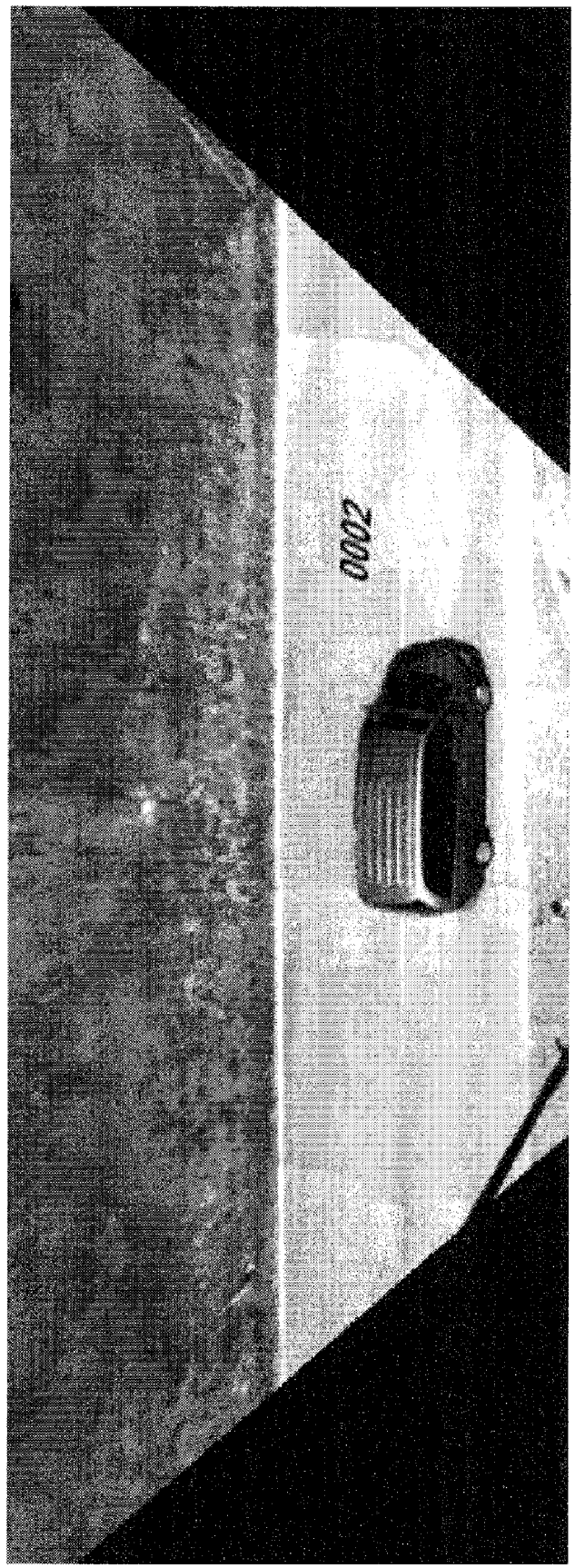
FIG. 4C is an exemplary homographied image generated from the exemplary distortion-corrected image in FIG. 4B according to an embodiment of the present invention.

Referring to FIGS. 4A-4C, exemplary images derived by image transformations on a visible light camera image are illustrated. FIG. 4A is an exemplary visible light camera image generated by a visible light camera. FIG. 4B is an exemplary distortion-corrected image generated by the exemplary visible light camera image in FIG. 4A. FIG. 4C is an exemplary homographied image generated from the exemplary distortion-corrected image in FIG. 4B.

In general, a distortion-corrected image may be generated by performing a distortion correction operation on an image generated by the visible light camera. A homographied image may be generated by performing a homography transformation on the distortion-corrected image. The pixel coordinate in the homographied image of the landmarks may then be fitted to the measured values of the real-world coordinate of the landmarks. A coordinate transformation is determined employing the same fitting parameters used for fitting the pixel coordinate in the homographied image of the landmarks. The coordinate transformation provides a one-to-one mapping between the pixel coordinate in the homographied image and the real-world coordinates, which may be an (x, y) coordinate including an x-axis and a y-axis.

Preferably, the x-axis is perpendicular to the center of the field of view of the high energy radiation imager, and the y-axis is parallel to the center of the field of view of the high energy radiation imager. Preferably, the x-axis is parallel to the general direction of the road of the path on land or sea.

The homographied images may have a homography reference plane that coincides with a surface of a road or a sea on which the moving vehicle travels. The distance between any pair of points located directly on the homography reference plane is proportional to distances between a corresponding pair of pixels in a homographied image.

Figure 5:
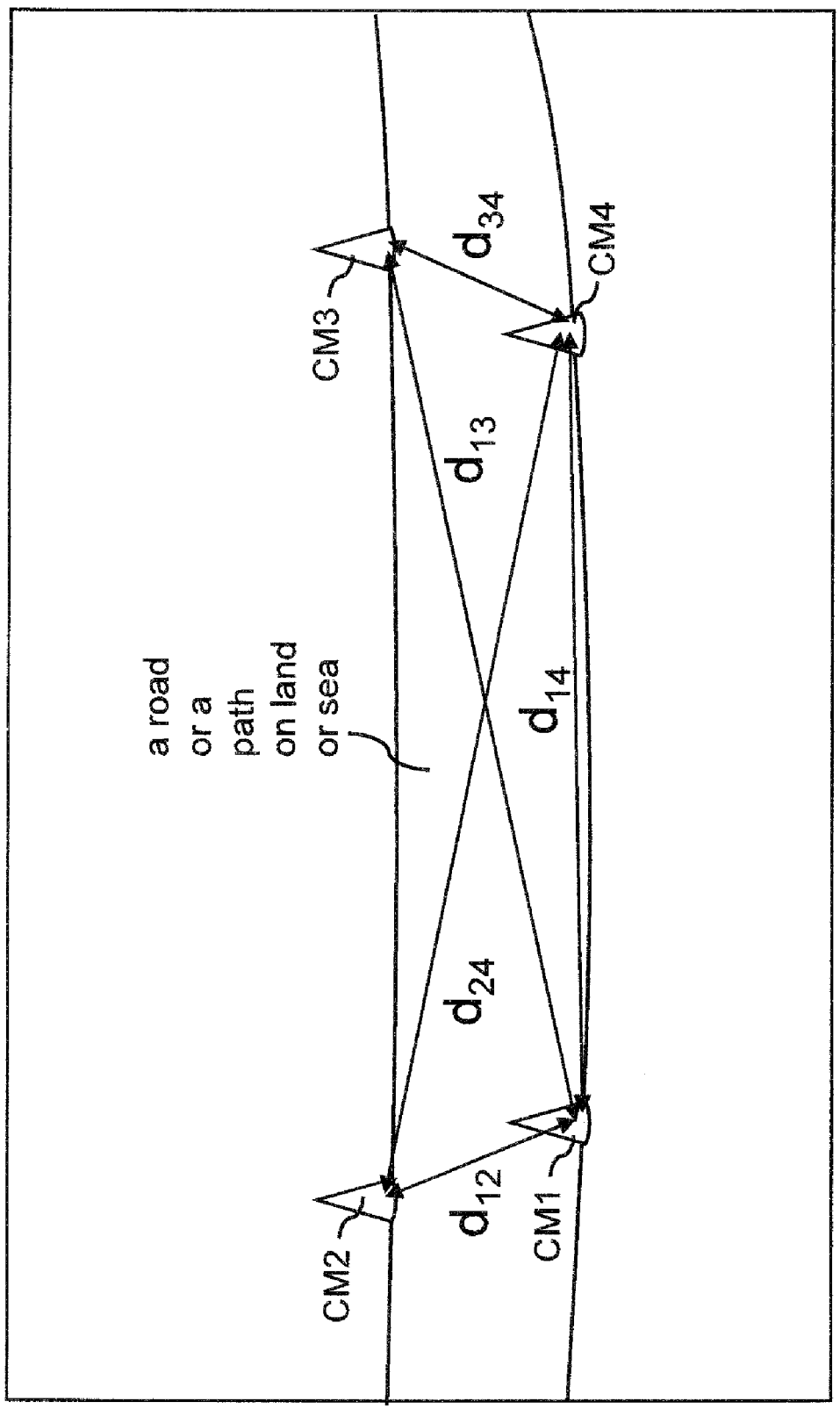
FIG. 5 is an exemplary setup for calibrating the homography transformation of images from a visible light camera according to an embodiment of the present invention.

Referring to FIG. 5, an exemplary setup for calibrating a homography transformation of images from a visible light camera is shown. Four calibration markers (CM1, CM2, CM3, CM4) are placed at sides of a road or a path on land or sea within the field of view of the visible light camera. The distances between the calibration markers such as the distances marked by $d_{12}$, $d_{13}$, $d_{14}$, $d_{24}$, and $d_{34}$, are measured to calculate the real-world coordinates of the calibration markers. The corresponding pixel coordinates are measured in the image of the visible light camera and/or the homographied image. A homography matrix is calculated from the real-world coordinates of the calibration markers and the corresponding pixel coordinates of the homographied image. The position of one of the calibration markers may be designated as the origin of the real-world coordinate.

Referring to step 500 of the flow chart 30, high energy radiation sources are placed within the field of view of the high energy radiation imager and the high energy radiation imager pixel (HERIP) positions for the high energy radiation sources are computed. This step corresponds to the beginning of the first stage of calibration. A high energy radiation imager pixel (HERIP) position may be a one dimensional parameter that marks the location of a detected high energy radiation signal along the lateral direction of the high energy radiation imager, which is preferably substantially parallel to the direction of the road or the path on land or sea.

Figure 6:
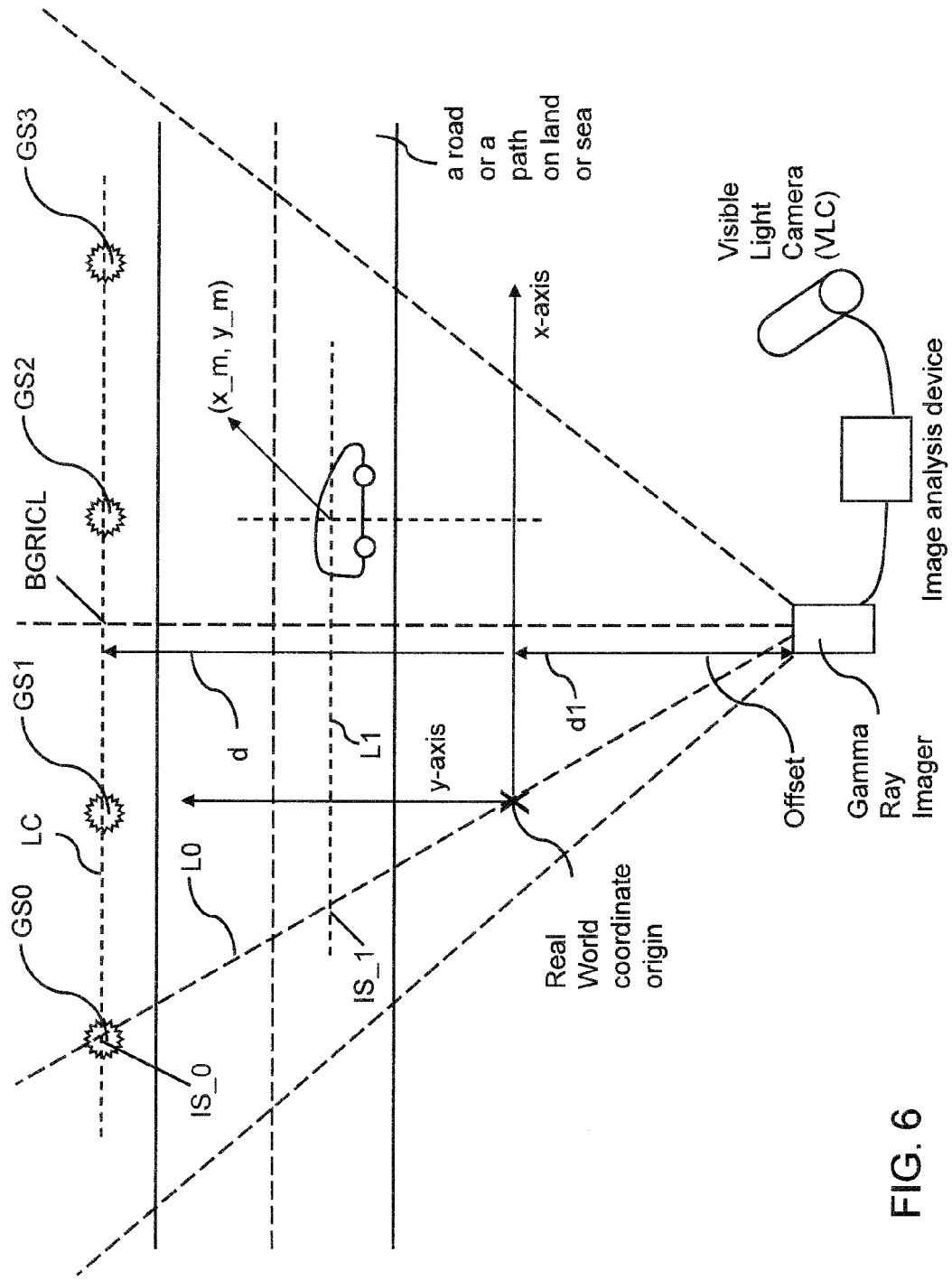
FIG. 6 is an exemplary setup that may be employed to calibrate the high energy radiation imager pixel position relative to a real-world coordinate system according to an embodiment of the present invention.

Referring to FIG. 6, an exemplary setup that may be employed to calibrate the high energy radiation imager pixel position relative to a real-world coordinate system is shown. In one embodiment, high energy radiation sources (GS0, GS1, GS2, GS3) are placed sequentially and high energy radiation images and corresponding video light camera images are generated sequentially for each of the high energy radiation sources (GS0, GS1, GS2, GS3). In another embodiment, the high energy radiation sources (GS0, GS1, GS2, GS3) are placed concurrently and high energy radiation images and corresponding video light camera images are generated concurrently for all of the high energy radiation sources (GS0, GS1, GS2, GS3). At least two high energy radiation sources (GS0, GS1, GS2, GS3) employed, and preferably, at least three high energy radiation sources (GS0, GS1, GS2, GS3) are employed.

Preferably, the high energy radiation sources are placed in a line parallel to the x-axis of the real-world coordinate system, i.e., at real-world coordinates having the same y-coordinate. In this case, the y-coordinate of the high energy radiation sources (GS0, GS1, GS2, GS3) in the real-world coordinate system is herein referred to as a radiation source y-coordinate d, which is herein referred to as a "fixed real-world y-coordinate." Preferably, the y-axis of the fixed real-world y-coordinate is perpendicular to an image plane of the high energy radiation imager. To facilitate the calculation, one of the high energy radiation sources (GS0, GS1, GS2, GS3) may be placed in the line of sight from the high energy radiation imager to the origin of the real-world coordinate system.

After placement, the real-world coordinates of the gamma-ray sources (GS0, GS1, GS2, GS3) are physically measured. Alternately, real-world coordinates of the gamma-ray sources (GS0, GS1, GS2, GS3) may be calculated from a visible light camera image or a homographied image therefrom instead of measuring the real-world coordinates of the gamma-ray sources.

Referring to step 600 of the flow chart 30, the HERIP positions corresponding to the real-world x-coordinates of the gamma-ray sources (GS0, GS1, GS2, GS3) are determined. A fitting equation is provided to correlate the HERIP positions, which are herein referred to as "baseline high energy radiation imager pixel positions," of each of the gamma-ray sources (GS0, GS1, GS2, GS3) as detected by the high energy radiation imager to the real-world x-coordinates of the gamma-ray sources (GS0, GS1, GS2, GS3). The formula may have the form of:

$$HERIP\_p = SP\_b \times (X\_real\_world) + Intercept\_b, \quad (1)$$

wherein HERIP_p is a HERIP position, SP_b is a baseline scale parameter, X_real_world is the x-coordinate of the real-world coordinate, and Intercept_b is a baseline intercept high energy radiation imager pixel position, which is the HERIP position for a high energy radiation source that is present, or would be present, along the line of sight connecting the high energy radiation imager and the origin of the real-world coordinate system and at a location having the fixed real-world y-coordinate of d.

The various measured values of X_real_world for the gamma-ray sources (GS0, GS1, GS2, GS3) and the corresponding measured values of the HERIP positions of the high energy radiation imager are used to solve formula (1) for the intercept high energy radiation imager pixel position Intercept_b of the high energy radiation imager and the baseline scale parameter SP_b. The intercept high energy radiation imager pixel position is the HERIP position that corresponds to a real-world coordinate of an intersection point, which is herein referred to as a baseline intersection point IS_0, between a line L0 connecting a focal point of said high energy radiation imager and the origin of a real-world coordinate system and a line LC having the fixed real-world y-coordinate of d, i.e., the y-coordinate of the same value as the y-coordinate of the real-world coordinates of the gamma-ray sources (GS0, GS1, GS2, GS3).

The intercept high energy radiation imager pixel position Intercept_b of the high energy radiation imager and the baseline scale parameter SP_b in formula (1) may be determined by performing a least square fitting between the multiple values of the baseline high energy radiation imager pixel positions and corresponding multiple real-world coordinates having the variable real-world x-coordinate and the fixed real-world y-coordinate. The baseline scale parameter is selected to minimize a fitting error in the least square fitting.

The baseline scale parameter SP_b represents a change in a baseline high energy radiation imager pixel position of the high energy radiation imager as a function of a real-world coordinate having variable real-world x-coordinate and the fixed real-world y-coordinate of d.

Due to the inherent geometric relationship inherent in the optics of the high energy radiation imager, the baseline scale parameter SP_b has the relationship of:

$$SP\_b = (1/R\_cal) \times (2 \times A/B), \quad (2)$$

wherein R_cal is a sum of a first distance d1 between the high energy radiation imager and the x-axis of the real-world coordinate system and a second distance that is the same as the fixed real-world y-coordinate of d, A is a focal length of the high energy radiation imager, and B is a lateral physical dimension of an image screen of the high energy radiation imager. In other words, R_cal=d1+d.

Referring to step 700 of the flow chart 30, a formula for determining the HERIP positions corresponding to all real-world (x, y) coordinates is derived based on the results of the calibration employing the gamma-ray sources (GS0, GS1, GS2, GS3) at step 600. To enable a mapping between an arbitrary real-world coordinate and a corresponding HERIP position HERIP_, the following formula is employed:

$$HERIP\_p = SP\_at\_point \times (X\_real\_world) + Intercept\_at\_point\_range, \quad (3)$$

wherein SP_at_point is the scale parameter that depends on the real-world coordinate, and wherein Intercept_at_point_range is the intercept high energy radiation imager pixel position that depends on the real-world coordinate. The intercept high energy radiation imager pixel position corresponds to the real-world coordinate of an intersection point IS_1 between a line L0 connecting the focal point of the high energy radiation imager and the origin of the real-world coordinate system and a line L1 having a constant y-coordinate of the same value as the y-coordinate of the real-world coordinate. In case the real-world coordinate represents a real-world coordinate (x_m, y_m) of a moving vehicle, the line L1 having the constant y-coordinate has the y-coordinate value of y_m, i.e., the y-coordinate of the real-world coordinate corresponding to the position of the moving vehicle.

The value of the scale parameter SP_at_point and the value of the intercept high energy radiation imager pixel position Intercept_at_point_range are determined by the geometry of the exemplary apparatus.

In each line having a constant y-coordinate in the real-world coordinate system, the change in the x-coordinate for a unit change in the HERIP position is proportional to the distance between the line and the focal point of the high energy radiation imager. Thus, the value of the scale parameter SP_at_point is given by:

$$SP\_at\_point = (1/Range\_to\_point) \times (2 \times A/B), \quad (4)$$

wherein Range_to_point is the sum of the first distance d1 between the high energy radiation imager and the x-axis of the real-world coordinate system and a third distance that is the same as a y-coordinate of the real-world coordinate corresponding to a position of the moving vehicle. In other words, Range_at_point=d1+(Y_real_world), wherein (Y_real_world) is the value of the y-coordinate of the real-world coordinate.

Next, the x-coordinate of a baseline high energy radiation imager center location (BGRICL), or "x-coordinate_of_BGRICL," in the real-world coordinate system is determined. The baseline high energy radiation imager center location has a y-coordinate of the fixed real-world y-coordinate, i.e., d, and corresponds to a middle high energy radiation imager pixel position of the high energy radiation imager. For example, if D is a total number of pixels along a lateral direction in the high energy radiation imager, the middle high energy radiation imager pixel position is the (D/2)-th pixel from one end of the high energy radiation imager.

The intercept high energy radiation imager pixel position Intercept_at_point_range is then given by the formula:

$$Intercept\_at\_point\_range = (D/2) - x\text{-coordinate\_of\_BGRICL} \times SP\_at\_point, \quad (5)$$

wherein D is a total number of pixels along a lateral direction in the high energy radiation imager.

Referring to step 800 of flow chart 30, the formulas (3), (4), and (5) are combined to generate a calibration formula that maps an arbitrary real-world coordinate as observed by the visible light camera to a corresponding HERIP position HERIP_P, i.e., $$HERIP\_P = (1/Range\_to\_point) \times (2 \times A/B) \times (X\_real\_world) + (D/2) - x\text{-coordinate\_of BGRICL} \times (1/Range\_to\_point) \times (2 \times A/B), \quad (6)$$

or $$HERIP\_p = (D/2) + [1/(d1 + (Y\_real\_world))] \times (2 \times A/B) \times [(X\_real\_world) - x\text{-coordinate\_of BGRICL}], \quad (7)$$

Calculation of the calibration formula between the real-world coordinate system and the HERIP position is the last step of the first stage of calibration. Once a moving vehicle is detected by a visible light camera, the (x, y) coordinate of the moving vehicle, e.g., (x_m, y_m) is calculated by analyzing the visible light camera image, for example, by generating a distortion-corrected image and/or a homographied image.

x_m is substituted for (X_real_world) and y_m is substituted for (Y_real_world) in the formula (6) or in the formula (7) to provide a corresponding HERIP position for the high energy radiation imager. Further, employing the formulas (4) and/or (5), the value of the scale parameter SP_at_point and/or the value of the intercept high energy radiation imager pixel position Intercept_at_point_range may also be calculated explicitly or implicitly during the computation process.

In case at least two images are generated by the visible light camera, the speed of the vehicle may also be calculated based on the at least two images from the visible light camera. In this case, the rate of change in the high energy radiation imager pixel position may be determined based on the speed and the scale parameter. The rate of change in the high energy radiation imager pixel is equal to a product of the speed and the scale parameter.

Upon detection of a moving vehicle, the image analysis device preferably executes a program of machine-executable instructions to integrate an intensity of detected high energy radiation imager around the high energy radiation imager pixel position over time such that the high energy radiation imager pixel position changes at a rate of change that is calculated from the speed and the scale parameter. The rate of the change in the high energy radiation imager pixel position is the calculated based on the rate of the change in the real-world coordinate of the moving vehicle. The step of repeating the step of determining the visible light camera pixel coordinate and the step of determining the high energy radiation imager pixel position may be repeated while the moving vehicle remains in the field of view of the visible light camera and in the field of view of the high energy radiation imager.

In addition, the length of the moving vehicle may be determined based on an image of the visible light camera, and the high energy radiation imager pixel range corresponding to the length of the vehicle may be determined based on the scale parameter. The high energy radiation imager pixel range is proportional to the scale parameter and to the length of the moving vehicle, i.e., proportional to the product of the scale parameter and to the length of the moving vehicle.

Figure 7:
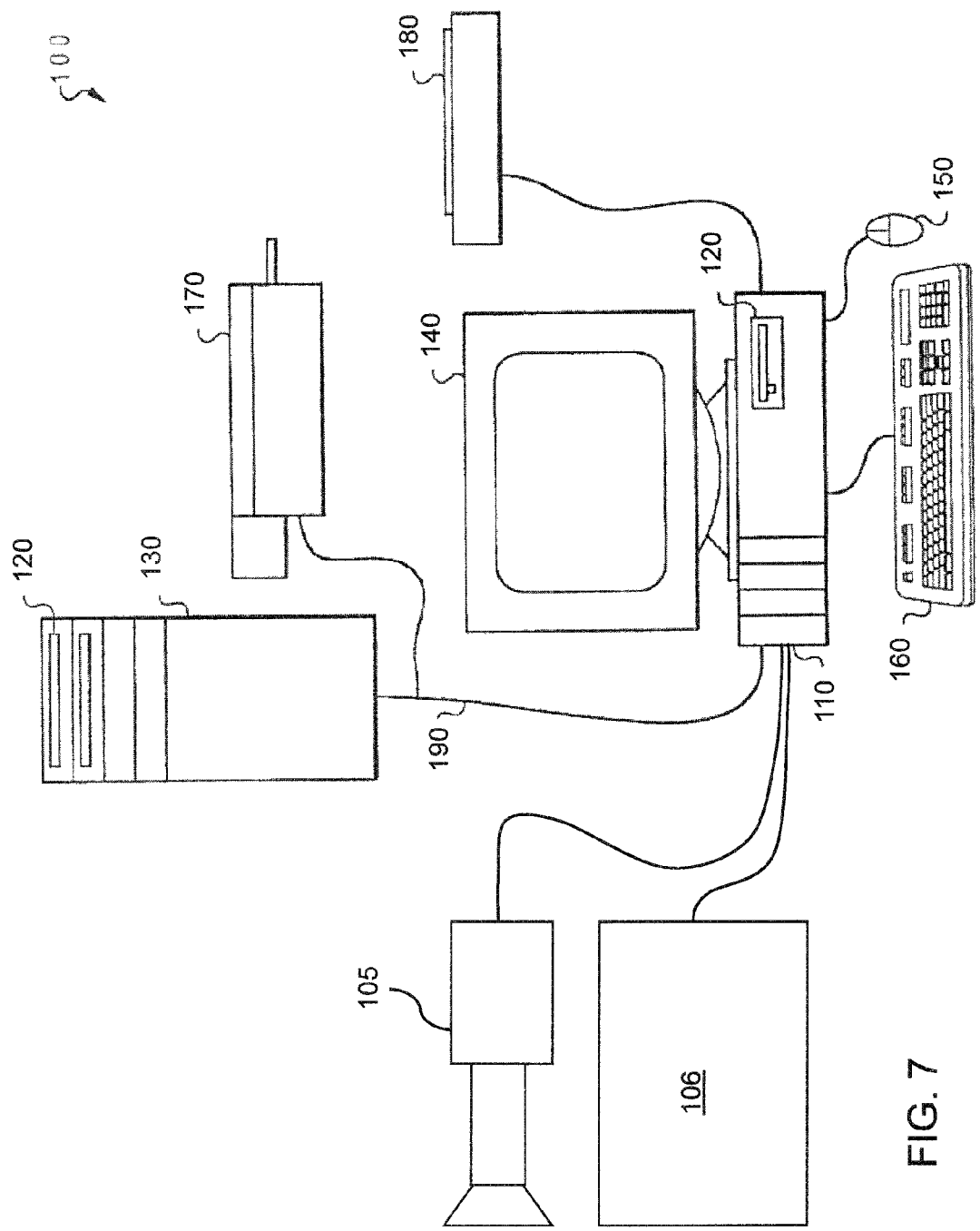
FIG. 7 is an exemplary apparatus according to an embodiment of the present invention.

Referring to FIG. 7, an exemplary apparatus 100 according to the present invention is shown. The exemplary apparatus 100 is a computer-based system in which a method embodiment of the invention may be carried out. The computer-based system includes a processing unit 110, which houses a processor, memory and other systems components (not shown expressly in the drawing) that implement a general purpose or special purpose processing system, or computer that may execute a computer program product. The computer program product may comprise media, for example a compact storage medium such as a compact disc, which may be read by the processing unit 110 through a disc drive 120, or by any means known to the skilled artisan for providing the computer program product to the general purpose processing system for execution thereby. The exemplary apparatus 100 includes a visible light camera 105 and a high energy radiation imager 106 that continuously monitor the path of vehicles.

The computer program product may comprise all the respective features enabling the implementation of the inventive method described herein, and which is able to carry out the method when loaded in a computer system. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product may be stored on hard disk drives within processing unit 110, as mentioned, or may be located on a remote system such as a server 130, coupled to processing unit 110, via a network interface such as an Ethernet interface. Monitor 140, mouse 150 and keyboard 160 are coupled to the processing unit 110, to provide user interaction. Scanner 180 and printer 170 are provided for document input and output. Printer 170 is shown coupled to the processing unit 110 via a network connection, but may be coupled directly to the processing unit 110. Scanner 180 is shown coupled to the processing unit 110 directly, but it should be understood that peripherals might be network coupled, or direct coupled without affecting the ability of the processing unit 110 to perform the method of the invention.

A data storage device that is programmable and readable by a machine and tangibly embodying or storing a program of instructions that are executable b the machine to perform the methods described herein may also be provided.

While the invention has been described in terms of specific embodiments, it is evident in view of the foregoing description that numerous alternatives, modifications and variations will be apparent to those skilled in the art. Other suitable modifications and adaptations of a variety of conditions and parameters normally encountered in image processing, obvious to those skilled in the art, are within the scope of this invention. All publications, patents, and patent applications cited herein are incorporated by reference in their entirety for all purposes to the same extent as if each individual publication, patent, or patent application were specifically and individually indicated to be so incorporated by reference. Accordingly, the invention is intended to encompass all such alternatives, modifications and variations which fall within the scope and spirit of the invention and the following claims.

What is claimed is:

1. An apparatus for detecting a radiation source, said apparatus comprising:
   a visible light camera that detects electromagnetic radiation in a visible range;
   a high energy radiation imager that detects high energy radiation; and
   an image analysis device that is configured to execute a program of machine-executable instructions to calibrate high energy radiation imager pixels of said high energy radiation imager to a real-world coordinate of a moving vehicle, wherein said program includes the steps of:
   determining a visible light camera pixel coordinate of a moving vehicle;
   determining a real-world coordinate of said moving vehicle based on said visible light camera pixel coordinate;
   determining a high energy radiation imager pixel position based on said real-world coordinate of said moving vehicle; and
   determining a scale parameter for said high energy radiation imager based on said real-world coordinate, wherein said scale parameter correlates a change in said high energy radiation imager pixel position to a change in an x-coordinate of said real-world coordinate in a real-world coordinate system having an x-axis that is parallel to an image plane of said high energy radiation imager.

2. The apparatus of claim 1, wherein said program further includes the step of determining a speed of said vehicle based on at least two images from said visible light camera.

3. The apparatus of claim 2, wherein said program further includes the step of determining a rate of change in said high energy radiation imager pixel position based on said speed and said scale parameter.

4. The apparatus of claim 3, wherein said rate of change in said high energy radiation imager pixel is equal to a product of said speed and said scale parameter.

5. The apparatus of claim 2, wherein said image analysis device is configured to execute another program of machine-executable instructions to integrate an intensity of detected high energy radiation imager around said high energy radiation imager pixel position over time, wherein said high energy radiation imager pixel position changes at a rate of change that is calculated from said speed and said scale parameter.

6. The apparatus of claim 5, wherein said rate of change in said high energy radiation imager pixel is equal to a product of said speed and said scale parameter.

7. The apparatus of claim 1, wherein said program further includes the step of repeating said step of determining said visible light camera pixel coordinate and said step of determining said high energy radiation imager pixel position while said moving vehicle remains in a field of view of said visible light camera and in a field of view of said high energy radiation imager.

8. The apparatus of claim 1, wherein said program further includes the steps of:
   determining a length of said moving vehicle based on an image of said visible light camera; and
   determining a high energy radiation imager pixel range corresponding to said length based on said scale parameter, wherein said high energy radiation imager pixel range is proportional to said scale parameter.

9. The apparatus of claim 1, wherein said program further includes determining a baseline scale parameter that represents a change in a baseline high energy radiation imager pixel position of said high energy radiation imager as a function of a real-world coordinate having a variable real-world x-coordinate and a fixed real-world y-coordinate, wherein a y-axis of said fixed real-world y-coordinate is perpendicular to an image plane of said high energy radiation imager.

10. The apparatus of claim 9, wherein said baseline scale parameter is given by: SP_b=(1/R_cal)×(2×A/B), wherein SP_b is said baseline scale parameter, R_cal is a sum of a first distance between said high energy radiation imager and said x-axis of said real-world coordinate system and a second distance that is the same as said fixed real-world y-coordinate, A is a focal length of said high energy radiation imager, and B is a lateral physical dimension of an image screen of said high energy radiation imager.

11. The apparatus of claim 10, wherein said scale parameter is given by: SP_at_point=(1/Range_to_point)×(2×A/B), wherein SP_at_point is said scale parameter, Range_to_point is a sum of said first distance between said high energy radiation imager and said x-axis of said real-world coordinate system and a third distance that is the same as a y-coordinate of said real-world coordinate corresponding to a position of said moving vehicle.

12. The apparatus of claim 11, wherein said program further includes the step of determining an x-coordinate of a baseline high energy radiation imager center location (BG-RICL), wherein said baseline high energy radiation imager center location has a y-coordinate of said fixed real-world y-coordinate and corresponds to a middle high energy radiation imager pixel position of said high energy radiation imager.

13. The apparatus of claim 12, wherein said program further includes the step of determining an intercept high energy radiation imager pixel position of said high energy radiation imager, wherein said intercept high energy radiation imager pixel position corresponds to a real-world coordinate of an intersection point between a line connecting a focal point of said high energy radiation imager and an origin of said real-world coordinate system and a line having a constant y-coordinate of a same value as said y-coordinate of said real-world coordinate corresponding to said position of said moving vehicle.

14. The apparatus of claim 13, wherein said program further includes the step of determining a baseline intercept high energy radiation imager pixel position of said high energy radiation imager, wherein said base intercept high energy radiation imager pixel position corresponds to a real-world coordinate of another intersection point between a line connecting a focal point of said high energy radiation imager and an origin of said real-world coordinate system and a line having a constant y-coordinate of a same value as said fixed real-world y-coordinate.

15. The apparatus of claim 14, wherein said intercept high energy radiation imager pixel position is given by: Intercept_at_point_range=(D/2)−x-coordinate_of_BGRICL×SP_at_point, wherein Intercept_at_point_range is said intercept high energy radiation imager pixel position, D is a total number of pixels along a lateral direction in said high energy radiation imager, x-coordinate_of_BGRICL is said x-coordinate of said baseline high energy radiation imager center location (BGRICL).

16. The apparatus of claim 15, wherein said high energy radiation imager pixel position is given by: HERIP_P=SP_at_point×(X_real_world)+Intercept_at_point_range, wherein HERIP_p is said high energy radiation imager pixel position and said X_real_world is said x-coordinate of said real-world coordinate.

17. The apparatus of claim 9, wherein said program further includes the step of performing a least square fitting between multiple values of baseline high energy radiation imager pixel positions and corresponding multiple real-world coordinates having said variable real-world x-coordinate and said fixed real-world y-coordinate, wherein said baseline scale parameter is selected to minimize a fitting error in said least square fitting.

18. The apparatus of claim 1, wherein said program further includes the step of performing a distortion correction operation on an image generated by said visible light camera to generate a distortion-corrected image.

19. The apparatus of claim 18, wherein said program further includes the step of performing a homography transformation on said distortion-corrected image to generate a homographied image.

20. The apparatus of claim 19, wherein said homographied image has a homography reference frame that coincides with a surface of a road on which said moving vehicle travels, wherein distances between any pair of points located directly on said road is proportional to distances between a corresponding pair of pixels in said homographied image.

21. The apparatus of claim 20, wherein said program further includes the step of determining said real-world coordinate employing a pixel coordinate in said homographied image.

22. A method for calibrating high energy radiation imager pixels to a real-world coordinate of a moving vehicle, said method comprising:
generating a visible light camera image of a moving vehicle;
determining a visible light camera pixel coordinate of said moving vehicle in said visible light camera image;
determining a real-world coordinate of said moving vehicle based on said visible light camera pixel coordinate;
determining a high energy radiation imager pixel position of a high energy radiation imager based on said real-world coordinate of said moving vehicle; and
determining a scale parameter for said high energy radiation imager based on said real-world coordinate, wherein said scale parameter correlates a change in said high energy radiation imager pixel position to a change in an x-coordinate of said real-world coordinate in a real-world coordinate system having an x-axis that is parallel to an image plane of said high energy radiation imager.

23. The method of claim 22, further comprising determining a speed of said vehicle based on at least two images from said visible light camera.

24. The method of claim 23, further comprising determining a rate of change in said high energy radiation imager pixel position based on said speed and said scale parameter.

25. The method of claim 24, wherein said rate of change in said high energy radiation imager pixel is equal to a product of said speed and said scale parameter.

26. The method of claim 22, further comprising repeating said step of determining said visible light camera pixel coordinate and said step of determining said high energy radiation imager pixel position while said moving vehicle remains in a field of view of said visible light camera and in a field of view of said high energy radiation imager.

27. The method of claim 22, further comprising:
determining a length of said moving vehicle based on an image of said visible light camera; and
determining a high energy radiation imager pixel range corresponding to said length based on said scale parameter, wherein said high energy radiation imager pixel range is proportional to said scale parameter.

28. The method of claim 22, further comprising determining a baseline scale parameter that represents a change in a baseline high energy radiation imager pixel position of said high energy radiation imager as a function of a real-world coordinate having a variable real-world x-coordinate and a fixed real-world y-coordinate, wherein a y-axis of said fixed real-world y-coordinate is perpendicular to an image plane of said high energy radiation imager.

29. The method of claim 28, wherein said baseline scale parameter is given by: SP_b=(1/R_cal)×(2×A/B), wherein SP_b is said baseline scale parameter, R_cal is a sum of a first distance between said high energy radiation imager and said x-axis of said real-world coordinate system and a second distance that is the same as said fixed real-world y-coordinate, A is a focal length of said high energy radiation imager, and B is a lateral physical dimension of an image screen of said high energy radiation imager.

30. The method of claim 29, wherein said scale parameter is given by:
SP_at_point=(1/Range_to_point)×(2×A/B), wherein SP_at_point is said scale parameter, Range_to_point is a sum of said first distance between said high energy radiation imager and said x-axis of said real-world coordinate system and a third distance that is the same as a y-coordinate of said real-world coordinate corresponding to a position of said moving vehicle.

31. A method of detecting a radiation source, said method comprising:
providing a visible light camera that detects electromagnetic radiation in a visible range;

providing a high energy radiation imager that detects high energy radiation;

calibrating high energy radiation imager pixels to a real-world coordinate of a moving vehicle by generating a visible light camera image of a moving vehicle; by determining a visible light camera pixel coordinate of said moving vehicle in said visible light camera image; by determining a real-world coordinate of said moving vehicle based on said visible light camera pixel coordinate; by determining a high energy radiation imager pixel position of a high energy radiation imager based on said real-world coordinate of said moving vehicle; and by determining a scale parameter for said high energy radiation imager based on said real-world coordinate, wherein said scale parameter correlates a change in said high energy radiation imager pixel position to a change in an x-coordinate of said real-world coordinate in a real-world coordinate system having an x-axis that is parallel to an image plane of said high energy radiation imager; and integrating an intensity of detected high energy radiation imager around said high energy radiation imager pixel position over time, wherein said high energy radiation imager pixel position changes at a rate of change that is calculated from said speed and said scale parameter.

32. The method of claim 31, wherein said rate of change in said high energy radiation imager pixel is equal to a product of said speed and said scale parameter.

33. A machine-readable data storage device embodying a program of machine-executable instructions to calibrate high energy radiation imager pixels to a real-world coordinate of a moving vehicle, wherein said program includes the steps of:

determining a visible light camera pixel coordinate of a moving vehicle in a visible light camera image;

determining a real-world coordinate of said moving vehicle based on said visible light camera pixel coordinate;

determining a high energy radiation imager pixel position of a high energy radiation imager based on said real-world coordinate of said moving vehicle; and determining a scale parameter for said high energy radiation imager based on said real-world coordinate, wherein said scale parameter correlates a change in said high energy radiation imager pixel position to a change in an x-coordinate of said real-world coordinate, wherein an x-axis of said real-world coordinate system is parallel to an image plane of said high energy radiation imager.

34. The machine-readable data storage device of claim 33, wherein said program further includes the step of determining a speed of said vehicle based on at least two images from said visible light camera.

35. The machine-readable data storage device of claim 34, wherein said program further includes the step of determining a rate of change in said high energy radiation imager pixel position based on said speed and said scale parameter.

36. The machine-readable data storage device of claim 35, wherein said rate of change in said high energy radiation imager pixel is equal to a product of said speed and said scale parameter.

37. The machine-readable data storage device of claim 33, wherein said program further includes the step of repeating said step of determining said visible light camera pixel coordinate and said step of determining said high energy radiation imager pixel position while said moving vehicle remains in a field of view of said visible light camera and in a field of view of said high energy radiation imager.

38. The machine-readable data storage device of claim 33, wherein said program further includes the steps of:

determining a length of said moving vehicle based on an image of said visible light camera; and determining a high energy radiation imager pixel range corresponding to said length based on said scale parameter, wherein said high energy radiation imager pixel range is proportional to said scale parameter.

39. The machine-readable data storage device of claim 33, wherein said program further includes the step of determining a baseline scale parameter that represents a change in a baseline high energy radiation imager pixel position of said high energy radiation imager as a function of a real-world coordinate having a variable real-world x-coordinate and a fixed real-world y-coordinate, wherein a y-axis of said fixed real-world y-coordinate is perpendicular to an image plane of said high energy radiation imager.

40. The machine-readable data storage device of claim 39, wherein said baseline scale parameter is given by: $SP\_b=(1/R\_cal) \times (2 \times A/B)$, wherein $SP\_b$ is said baseline scale parameter, $R\_cal$ is a sum of a first distance between said high energy radiation imager and said x-axis of said real-world coordinate system and a second distance that is the same as said fixed real-world y-coordinate, A is a focal length of said high energy radiation imager, and B is a lateral physical dimension of an image screen of said high energy radiation imager.

41. The machine-readable data storage device of claim 40, wherein said scale parameter is given by: $SP\_at\_point=(1/Range\_to\_point) \times (2 \times A/B)$, wherein $SP\_at\_point$ is said scale parameter, $Range\_to\_point$ is a sum of said first distance between said high energy radiation imager and said x-axis of said real-world coordinate system and a third distance that is the same as a y-coordinate of said real-world coordinate corresponding to a position of said moving vehicle.

* * * * *